United States Patent
Lai et al.

(10) Patent No.: US 7,231,560 B2
(45) Date of Patent: Jun. 12, 2007

(54) APPARATUS AND METHOD FOR TESTING MOTHERBOARD HAVING PCI EXPRESS DEVICES

(75) Inventors: Jiin Lai, Taipei (TW); Wayne Tseng, Taipei (TW)

(73) Assignee: Via Technologies, Inc., Taipei (TW)

( * ) Notice: Subject to any disclaimer, the term of this patent is extended or adjusted under 35 U.S.C. 154(b) by 261 days.

(21) Appl. No.: 10/985,461

(22) Filed: Nov. 10, 2004

(65) Prior Publication Data

US 2005/0235187 A1 Oct. 20, 2005

Related U.S. Application Data

(60) Provisional application No. 60/563,122, filed on Apr. 16, 2004.

(51) Int. Cl.
*G01R 31/28* (2006.01)
*G06F 11/00* (2006.01)

(52) U.S. Cl. ......................... 714/712; 714/43
(58) Field of Classification Search ............. None
See application file for complete search history.

(56) References Cited

U.S. PATENT DOCUMENTS

| | | | |
|---|---|---|---|
| 5,029,166 A | 7/1991 | Jarwala et al. | 371/22.1 |
| 6,311,296 B1 * | 10/2001 | Congdon | 714/56 |
| 6,421,798 B1 * | 7/2002 | Lin et al. | 714/718 |
| 6,915,343 B1 * | 7/2005 | Brewer et al. | 709/224 |
| 7,107,494 B1 * | 9/2006 | Tischler | 714/43 |

* cited by examiner

*Primary Examiner*—Christine T. Tu
(74) *Attorney, Agent, or Firm*—Kirkpatrick & Lockhart Preston Gates Ellis

(57) ABSTRACT

This invention discloses a method for testing at least one physical link on a motherboard associated with an on-board PCI Express device. A test card is connected to an input/output port on the motherboard, wherein the test card has a PCI Express test device. A test pattern is transmitted from the test card to the PCI Express device and receiving a test result pattern by the test card from the PCI Express device through the physical link for testing thereof. The test result pattern is examined to determine defects of the physical link on the motherboard.

22 Claims, 6 Drawing Sheets

APPARATUS AND METHOD FOR TESTING MOTHERBOARD HAVING PCI EXPRESS DEVICES

CROSS REFERENCE

This application claims the benefits of U.S. Patent Application Ser. No. 60/563,122, which was filed on Apr. 16, 2004 and entitled "Apparatus and Method for Testing Motherboard Having PCI Express Bus."

BACKGROUND

The present invention relates generally to a motherboard adopting Peripheral Component Interconnect (PCI) Express bus, and more particularly to an apparatus and method for testing the physical link paths of the same.

There has been a need of a higher-bandwidth, faster-speed interconnect technology for Personal Computer (PC) systems and peripherals. The low data transfer rate of the conventional PCI bus has become a bottleneck for developing faster computer systems. A standard 64-bit PCI running at 66 MHz of clock frequency has a data transfer rate of 533 MB/s. This imposes a limit on the development of software and peripherals.

PCI Express, formally known as the third generation I/O, has been introduced recently. A PCI Express link consists of multiple, point-to-point serial connections called lanes. Multiple lanes can be used to create an I/O interconnect whose bandwidth is linearly scalable. The first generation of PCI Express technology provides an effective 2.5 GB per second per lane per direction of raw bandwidth. This will greatly improve the performance of the computer systems, particularly in graphic processing.

Given that the PCI devices still dominate the current market, more PCI Express compatible devices need to be brought to the market. Thus, there is a need for proper methods and tools for testing the newly developed PCI Express devices.

As such, what is needed is a cost-efficient apparatus and method for testing the physical PCI Express link paths on a motherboard using PCI Express devices.

SUMMARY

In view of the foregoing, this invention provides a method and system for testing at least one physical link on a motherboard associated with an on-board PCI Express device. According to one embodiment, a test card is connected to a predetermined input/output port on the motherboard, wherein the test card has a PCI Express test device. A test pattern is transmitted from the test card to the PCI Express device. The test card receives a test result pattern from the PCI Express device through the physical link for testing thereof. The test result pattern is examined to determine defects of the physical link on the motherboard.

The construction and method of operation of the invention, however, together with additional objects and advantages thereof will be best understood from the following descriptions of specific embodiments when read in connection with the accompanying figures.

DESCRIPTION

Figure 1:
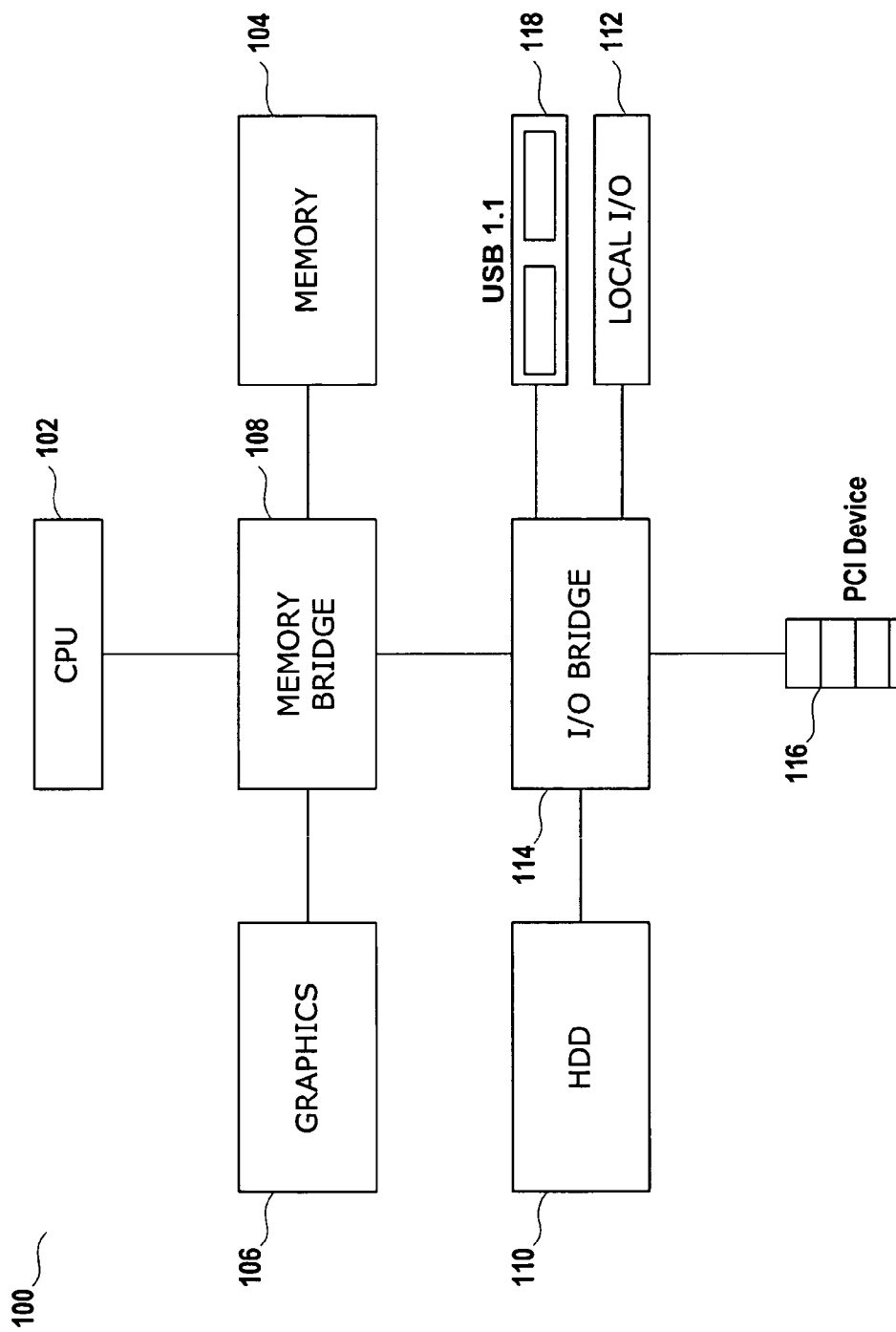
FIG. 1 presents a diagram showing components of a conventional computer system.

FIG. 1 presents a diagram 100 showing components of a conventional computer system. A typical computer system requires basic components such as a Central Processing Unit (CPU) 102, a memory module 104, and a graphics card 106 installed on the motherboard. In order for a computer to operate, these components are typically tied together with chipsets such as a memory bridge 108. The memory bridge 108 allows the CPU 102 to compute and solve algorithms while performing reading or writing operations to the memory module 104. System memory such as the memory module 104 is typically random access memory (RAM), and it is typically installed directly on the motherboard. The memory bridge 108 can also provide graphics display outputs to the graphics card 106 through a higher bandwidth link. For example, an Accelerated Graphics Port (AGP), not shown, may provide such a higher bandwidth link. Computer monitors can be connected to the graphics card 106 for visual display.

A computer system may also need to be able to connect to other I/O devices for input and output of data. Some examples of these I/O devices may be a CD-ROM, a floppy disk drive, and a hard disk drive 110. Depending on the needs of different users, these components can be very crucial to a computer system. For example, the hard disk drive 110 allows permanent storage of data without losing any information after power supply to the computer system is switched off. A block 112 represents any other local I/O devices that may be connected to the computer system. Chipsets such as an I/O bridge 114 allows the memory bridge 108 to perform input and output operations to these local I/O devices. PCI ports 116, which are connected to the I/O bridge 114, allow users to add other devices directly to the computer system, for example, some widely-available PCI devices including modems and network interface cards.

As computer technology continues to grow and make life easier for users, there is an increasing demand of devices that are both convenient and user-friendly. This demand gave birth of a long line of computer device products that can be connected to the computer system externally through USB ports 118 without the user installing anything on the motherboard itself. These USB ports 118 are typically located outside the casing of the computer system, thereby allowing the user to easily access them. The I/O bridge 114 allows devices that are connected to the USB ports 118 to communicate with the computer system as I/O devices.

Figure 2:
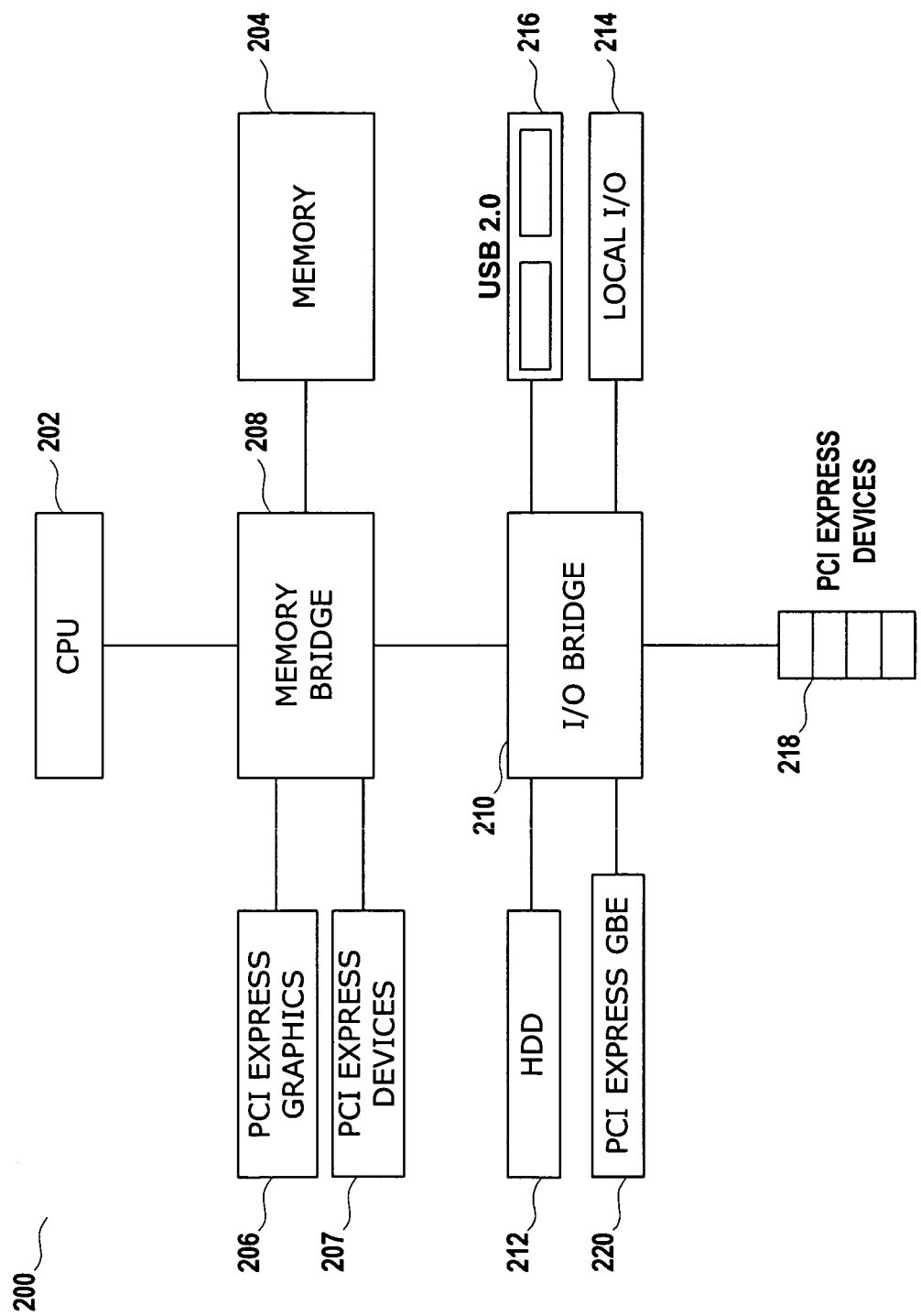
FIG. 2 presents a diagram showing components of a conventional computer system with a PCI Express bus.

FIG. 2 presents a diagram 200 showing components of a conventional computer system with a PCI Express bus. Similar to the computer system shown in FIG. 1, this computer system still requires many of the same key components such as a CPU 202, a memory module 204, and a graphics card 206 installed onto the motherboard. Due to newer technologies, the bandwidth of the link paths between devices and chipsets, such as a memory bridge 208 and an I/O bridge 210, may be able to increase significantly. Key components such as the CPU 202, the memory module 204, and a PCI Express graphics card 206 and some PCI devices 207 are still tied together via the memory bridge 208, while the I/O bridge 210 continues to provide the computer system with input and output operations to other devices. A hard disk drive 212 and other local I/O devices 214 such as CD-ROM and DVD-ROM are connected to the I/O bridge 210 through faster link paths such as serial Advanced Technology Attachment (ATA). The I/O bridge 210 is also designed to connect many other external devices through much faster USB 2.0 ports 216. Higher bandwidth PCI Express devices and PCI Express connectors are implemented to PCI-Express or PCI-X slots 218, thereby allowing better I/O performance with the I/O bridge 210. The computer system in FIG. 2 also allows the implementation of other next generation I/O technology, such as a gigabyte Ethernet 220 which may be very bandwidth demanding.

Figure 3:
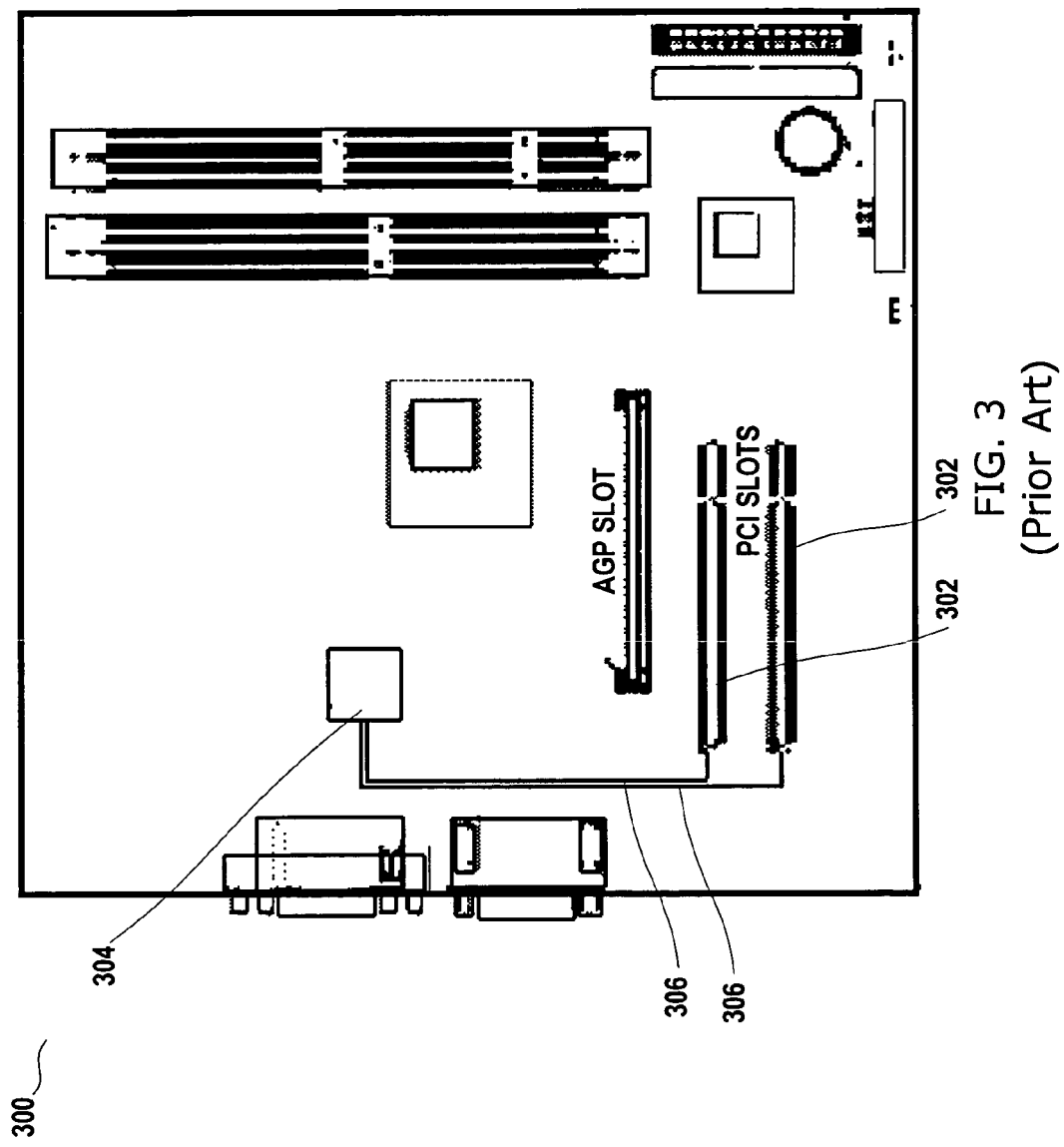
FIG. 3 illustrates a top view of a conventional motherboard containing a plurality of PCI Express connectors and a PCI Express device.

FIG. 3 illustrates a top view of a conventional motherboard 300 containing a plurality of PCI Express connectors 302 and a PCI Express device 304. Referring to FIG. 3, the PCI Express connectors 302 and the PCI Express device 304 are directly connected through physical link paths 306. The physical link paths 306 must be intact in order for the PCI slots to function correctly with the PCI device. A manufacturer of motherboards must run tests on the physical link paths 306 to ensure that the PCI slots are working properly.

Figure 4:
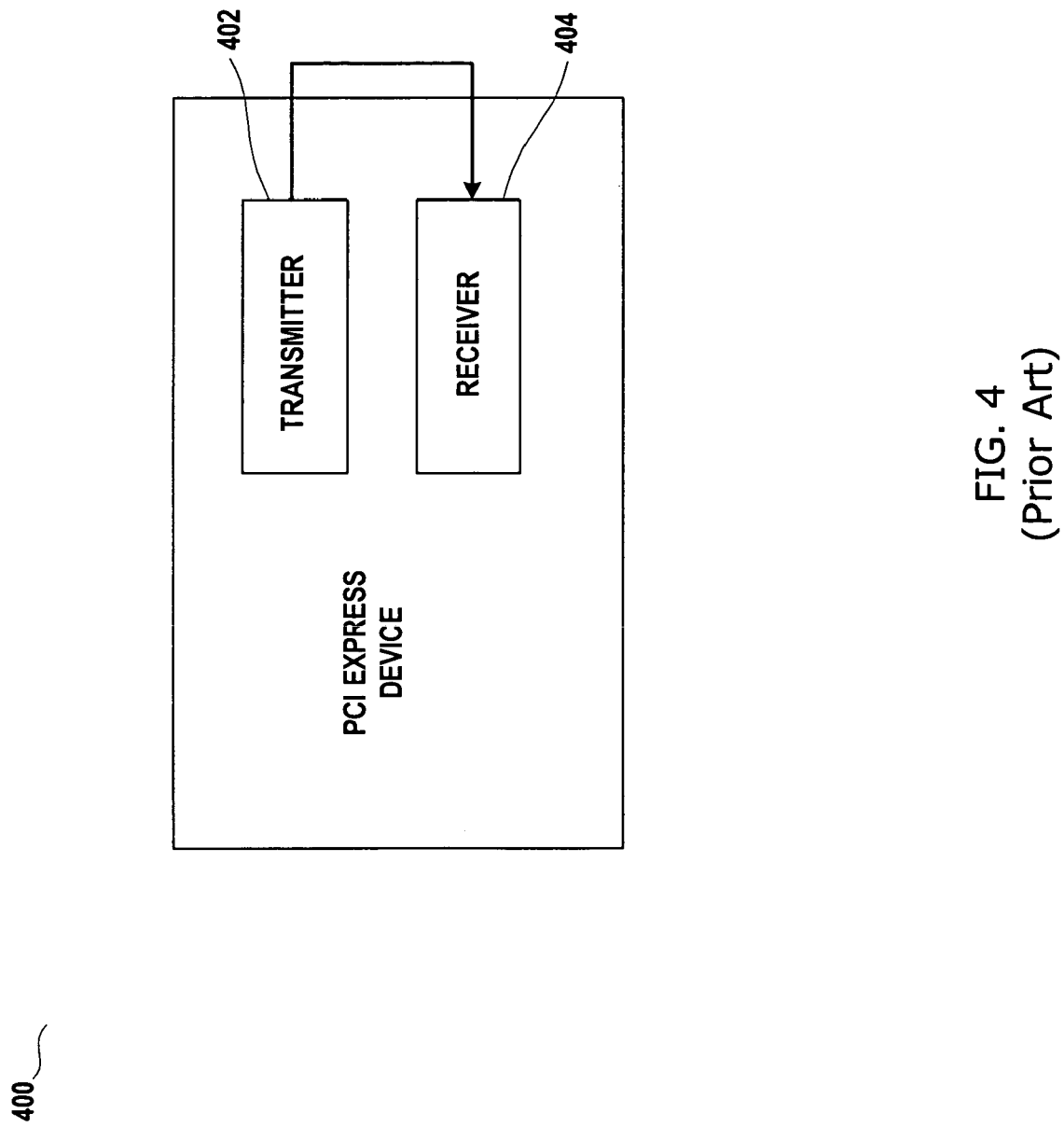
FIG. 4 presents a diagram showing a conventional loop-back test method for testing a PCI Express device.

FIG. 4 presents a diagram showing a conventional loopback test method for testing a PCI Express device 400 by connecting a transmitter 402 directly to a receiver 404 of the PCI Express device 400. The signals sent out from the transmitter 402 are looped back to the receiver 404 for self-testing the usability of the PCI Express device 400. This method is of limited use in testing a motherboard adopting PCI Express devices, because it is not able to test the physical PCI Express link paths connected to those devices on the motherboard and only a limited number of the PCI Express device's functions can be tested.

Figure 5:
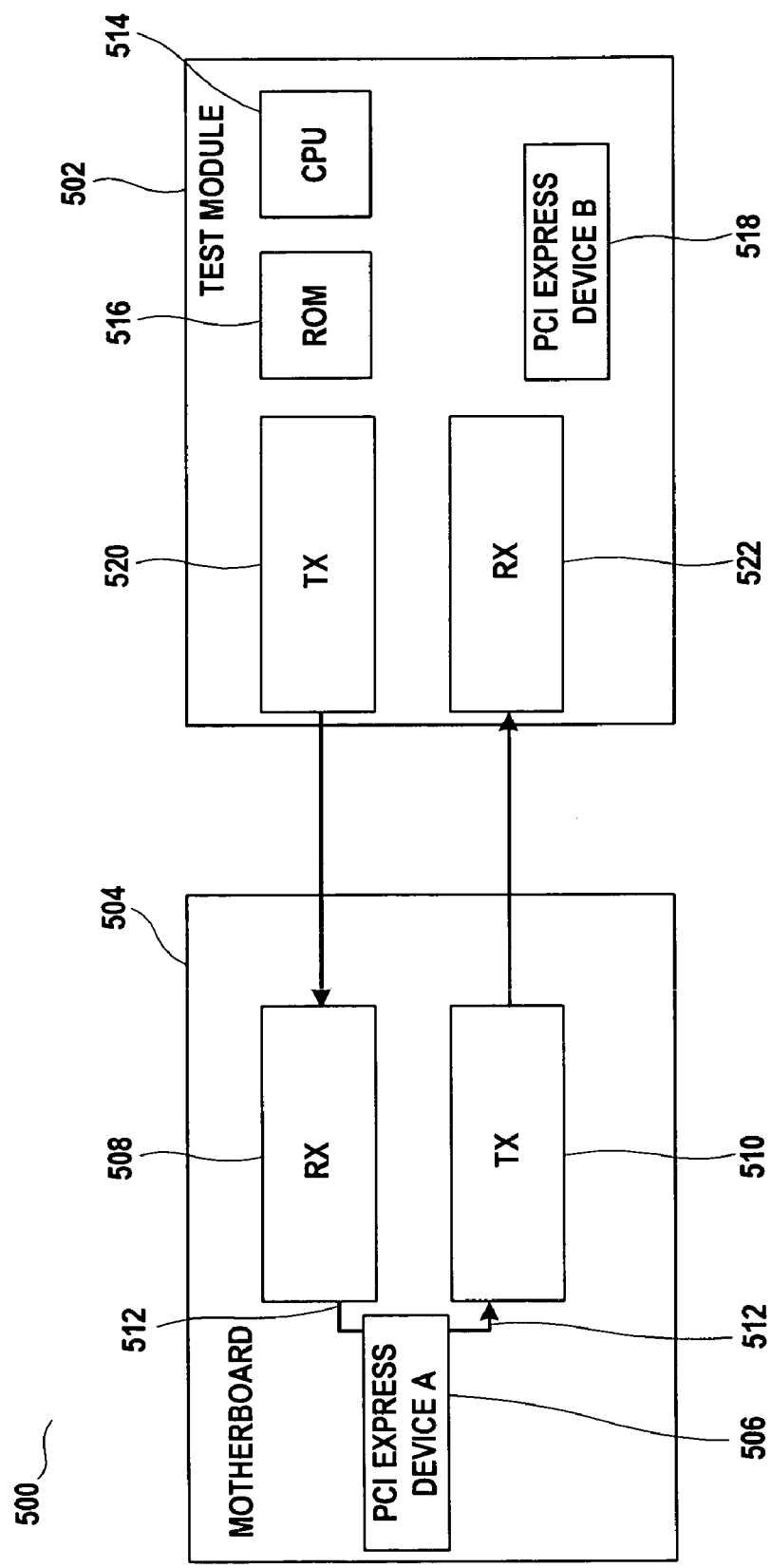
FIG. 5 presents a diagram showing the testing link between a test module and a motherboard in accordance with one embodiment of the present invention.

FIG. 5 presents a diagram 500 showing the physical testing link between a test module 502 and a motherboard 504, in accordance with one embodiment of the present invention. An on-board PCI Express device 506 has a receiver 508 and a transmitter 510. The on-board PCI Express device 506 may be a memory bridge, I/O bridge, mobile docking, graphic interface, and other chip sets or interfaces. The receiver 508 receives data from external devices via a physical link paths 512. The transmitter 510 transmits signals to external devices via the physical link path 512.

The test module 502 may include a Central Processing Unit (CPU) 514, a Read Only Memory (ROM) 516, an on-module PCI Express device 518, an on-module transmitter 520 and an on-module receiver 522. The ROM 516 is programmed to support the CPU 514, which commands or instructs the PCI Express device 518 to generate an embedded test bit sequence. The PCI Express device 518 forwards the embedded test bit sequence to the transmitter 520 and directs the same to transmit the sequence to the desired destination. The embedded test bit sequence is a string of bits generated for purposes of testing the physical link path 512 of the motherboard 504 and the usability of the PCI Express device 506 thereon. These test bit sequences may be test patterns commonly defined by IEEE, or proprietary test patterns for testing a specific PCI Express device made by a particular manufacturer. The test patterns are programmable and can be changed dynamically. Furthermore, a timing test pattern may be used for probing the latency information, which may vary among different motherboard manufacturers.

The test module 502 may be plugged into a slot or a programmable input/output port of the motherboard 504 in order to constitute the interconnection. Any slot can be tested by plugging the test module into the certain slot. The fingers of the module serve as the signal outlets of the on-module transmitter 520 and the signal inlets of the on-module receiver 522. Likewise, the pins on the sidewalls of the slot serve as the signal outlets and inlets of the physical link 512 for the transmitter 510 and the receiver 508. Each finger fits the corresponding pins of slot. When the module is plugged, the PCI Express test device receives instructions to establish a connection between the transmitter 520 and the receiver 522, routing though the physical link path on the motherboard 504, before the PCI Express test device transmits the programmable test pattern. The data links are, therefore, formed between the on-module transmitter 520 and the receiver 508, and between the on-module receiver 522 and the transmitter 510. Note that the data links can be formed via additional connectors and adaptors, without having the test module 502 directly plugged on the motherboard 504.

In the course of testing the motherboard 504, the data links to the test module 502 are established first. The on-module PCI Express device 518 sends out the embedded test bit sequence from the on-module transmitter 520 to the receiver 508 via the physical link path 512. The on-board PCI Express device 506 then transmits the sequence from the transmitter 510 via the physical link path 512 to the on-module receiver 522. The on-module PCI Express device 518 compares the sequence transmitted and the sequence received to determine whether the on-board PCI Express device 506 and the physical PCI Express link paths 512 have carried the sequence to its destination.

A main objective of this invention is to provide a simple check on the motherboard 504 to determine whether the on-board PCI Express device 506 and the physical link path 512 are working correctly. The embedded test bit sequence may simply be any string of binary bits. The sequence may not carry complicated commands designed to test the full functions of the PCI Express device 506 in order to simplify the system demand of the test module 502. Any undue complication will unnecessarily increase the cost of test.

The sequence is transmitted from the test module 502 to the motherboard 504 and looped back to it. The test module 502 does not need to be connected to any external computer for a full-function analysis of the motherboard 504, such as the conventional exerciser card that so does. It only requires that the test bit sequence sent out from the test module 502 runs through the physical PCI Express link paths 512, and sends backwards to the test module 502.

Figure 6:
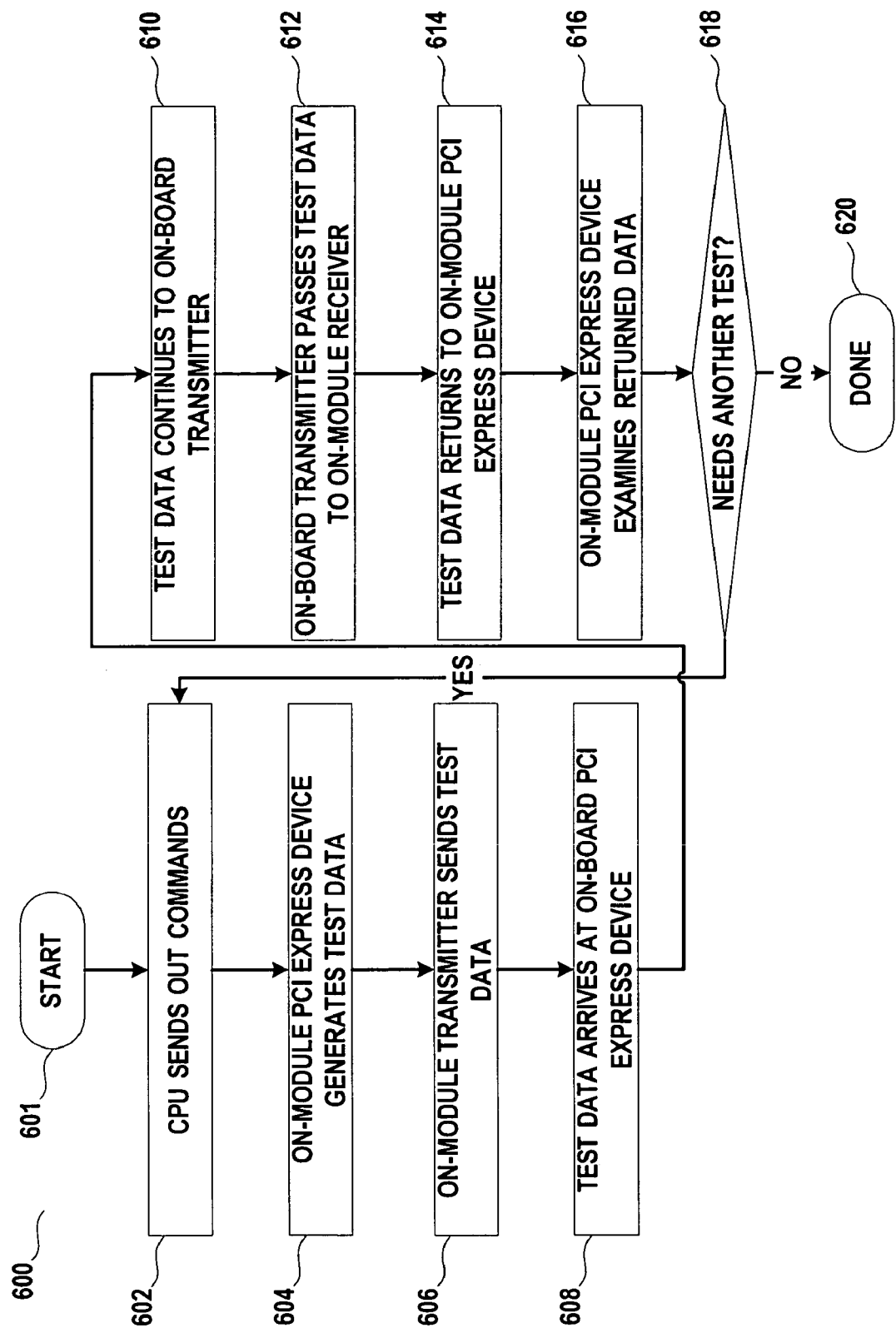
FIG. 6 presents a flow chart with steps taken by the improved method in accordance with one embodiment of the present invention.

FIG. 6 presents a flow chart 600 with steps taken by the improved testing method, in accordance with one embodiment of the present invention. The flow chart 600 represents the testing of one slot on the motherboard. The testing process begins with a step 601, when the test module is connected to a slot on the motherboard. The flow then proceeds to a step 602, when the CPU sends a signal to the on-board PCI Express device to set it up for a test mode and sends a command to the on-module PCI Express device to send out data that was stored in the ROM. The data from the on-module PCI Express device will arrive at the on-module transmitter in a step 604. When the testing module is connected to the motherboard, there will be a connection between the on-module transmitter and the receiver of the on-board PCI Express device via a physical link path. This allows the testing data to continue into the motherboard in a step 606. Since the purpose of this test is to do a quick check on the PCI Express device and the physical data paths of motherboard, steps 608 and 610 together show how the testing data travel through the physical link path to the receiver of the on-board PCI Express device, and exit the PCI Express device from its transmitter via the physical link path. The returning test data will arrive at the on-module receiver in a step 612. In a step 614, the data return to the on-module PCI Express device. By having the test data travel through the motherboard, the returning data is ready to be compared against the transmitted data. This examination is performed in a step 616. If the returning data and the transmitted data match, the test will be successful, thereby indicating that the on-board PCI Express device and link paths of the motherboard are operating correctly. If another test may be need, as determined by a step 618, another test can be performed by looping back to the step 602, when the CPU sends a command to the on-module PCI Express device to send out testing data. If no further tests are needed, the flow ends at a step 620, when the test module may be disconnected from the motherboard.

As shown above, the present invention describes a test module looping an embedded test bit sequence through the PCI Express device and physical link paths on a motherboard. The sequence is pre-programmed as a string of non-functional signals predominantly for the purposes of checking the usability of the physical PCI Express bus, without a full-blown diagnosis of on-board devices. This reduces the system requirement of the test module to a minimum level, so that it is able to test the physical PCI Express link paths on the motherboard in a cost-efficient way.

This invention utilizes a test module that is designed to connected to a programmable input/output port to send test data through the physical link paths and PCI Express device that are located on the motherboard. The test data is outputted by an on-module PCI Express device within the test module. Once the test data completes its course along the PCI Express device and link paths of the motherboard, the data is returned to the on-module PCI Express device within the test board for a comparison test. The result from the comparison test will determine if the physical links associated with the PCI Express device of the motherboard is functioning properly.

This invention is particularly cost-efficient when only the physical link paths of motherboards need to be tested in comparison with the conventional exerciser cards. This invention is able to test not only the device but also the physical link paths that otherwise cannot be tested under the conventional loopback method. As such, this invention is particularly suitable for quickly checking the PCI Express bus in motherboard fabrication.

The above illustration uses a PCI Express device testing configuration as an example. It is understood that the test methodology and hardware configuration can be used for applying a test module looping a test pattern through the predetermined on-board device to be tested and physical link paths on a receiving board of various kinds. For example, the receiving board can be a back plane of a telecommunication switch system, and the on-board device to be tested can be of any particular kind as long as it has modules coupled thereto or embedded therein for serially communicating with the test module. The test module may include another similar device that will initiate and complete the communications. The test pattern is pre-programmed for the purposes of checking the usability of the physical link paths, without a full-blown diagnosis of on-board devices.

This invention provides many different embodiments, or examples, for implementing different features of the invention. Specific examples of components and processes are described to help clarify the disclosure. These are, of course, merely examples and are not intended to limit the disclosure from that described in the claims.

Although illustrative embodiments of this invention have been shown and described, other modifications, changes, and substitutions are intended. Accordingly, it is appropriate that the appended claims be construed broadly and in a manner consistent with the scope of the disclosure, as set forth in the following claims.

What is claimed is:

1. A method for testing at least one physical link on a motherboard associated with an on-board PCI Express device, the method comprising:
    connecting a test card to a predetermined input/output port on the motherboard, the test card having a PCI Express test device;
    transmitting at least one predetermined test pattern from the test card to the on-board PCI Express device having a receiver and a transmitter;
    receiving a test result pattern by the test card from the on-board PCI Express device through the physical link for testing thereof; and
    examining the test result pattern to determine defects of the physical link on the motherboard.

2. The method of claim 1 wherein the predetermined test pattern is a programmable test pattern.

3. The method of claim 1 wherein the transmitting further includes communicating between the test card and the on-board PCI Express device using a programmable timing test pattern for checking a latency information of the physical link and the on-board PCI Express device.

4. The method of claim 1 wherein the transmitting further includes retrieving the predetermined test pattern from a memory device on the test card by a processor.

5. The method of claim 4 wherein the transmitting further includes transmitting the predetermined test pattern through a transmitter of the PCI Express test device.

6. The method of claim 1 wherein the receiving the test result pattern further includes receiving the test result pattern through a receiver of the PCI Express test device.

7. A test system for testing at least one physical link on a motherboard associated with an on-board PCI Express device, the system comprising:
    a processor;
    at least one memory device accessible by the processor;
    a connection means for connecting to at least one predetermined programmable input/output port on the motherboard for connecting to the on-board PCI Express device having a receiver and a transmitter through the physical link; and
    at least one PCI Express test device, wherein, under a control of the processor, the PCI Express test device transmits at least one programmable test pattern to the on-board PCI Express device and receives a test result pattern therefrom through the physical link for determining defects of the physical link on the motherboard.

8. The system of claim 7 further includes instructions coming from the processor for the PCI Express test device to establish a connection between a transmitter and a receiver thereof before the PCI Express test device transmits the programmable test pattern.

9. The system of claim 7 further includes instructions coming from the processor for the PCI Express test device to communicate with the on-board PCI Express device using a programmable timing test pattern for checking a latency information of the physical link and the on-board PCI Express device.

10. The system of claim 7 wherein the predetermined test pattern is stored in the at least one memory device.

11. The system of claim 7 wherein the physical link includes a connection link between one or more input/output pins of the on-board PCI Express device and the connection means.

12. A method for testing at least one physical link on a motherboard associated with an on-board PCI Express device, the method comprising:
- connecting a test card to at least one predetermined programmable input/output port on the motherboard, the test card having a PCI Express test device;
- setting up the on-board PCI Express device for testing;
- transmitting at least one predetermined test pattern from the test card;
- routing the predetermined test pattern to the programmable input/output port on the motherboard and further to the on-board PCI Express device having a receiver and a transmitter through the physical link;
- generating a test result pattern by the on-board PCI Express device;
- receiving the test result pattern by the test card from the on-board PCI Express device through the physical link and the input/output port for testing thereof; and
- examining the test result pattern to determine defects of the physical link on the motherboard.

13. The method of claim 12 wherein the predetermined test pattern is a timing test pattern for checking a latency information of the physical link and the on-board PCI Express device.

14. The method of claim 12 wherein the transmitting further includes retrieving the predetermined test pattern from a memory device on the test card by a processor.

15. The method of claim 14 wherein the transmitting further includes transmitting the predetermined test pattern through a transmitter of the PCI Express test device.

16. The method of claim 12 wherein the receiving the test result pattern further includes receiving the test result pattern through a receiver of the PCI Express test device.

17. The method of claim 12 wherein the predetermined test pattern is a programmable test pattern.

18. The system of claim 12 wherein the test pattern is an IEEE defined work pattern.

19. A method for testing at least one physical link on a predetermined hardware receiving board containing an on-board device to be tested, the method comprising:
- connecting a test card having a test device to a predetermined programmable input/output port on the receiving board;
- transmitting at least one programmable test pattern from the test card to the on-board device having a receiver and a transmitter through the physical link;
- receiving a test result pattern by the test card from the on-board device to be tested through the physical link for testing thereof; and
- examining the test result pattern to determine defects of the physical link, wherein the on-board device having a serial data transmission and reception function.

20. The method of claim 19 wherein the transmitting further includes communicating between the test card and the on-board device to be tested using a programmable timing test pattern for checking a latency information of the physical link and the on-board device.

21. The method of claim 19 wherein the transmitting further includes transmitting the predetermined test pattern through a transmitter of the test device.

22. The method of claim 19 wherein the receiving the test result pattern further includes receiving the test result pattern through a receiver of the test device.

* * * * *